United States Patent [19]

Hilton

[11] Patent Number: 4,594,555

[45] Date of Patent: Jun. 10, 1986

[54] FREQUENCY SELECTIVE SAMPLING DETECTOR

[75] Inventor: Howard E. Hilton, Snohomish, Wash.

[73] Assignee: Hewlett-Packard Company, Palo Alto, Calif.

[21] Appl. No.: 665,694

[22] Filed: Oct. 29, 1984

[51] Int. Cl.⁴ .............................................. H03D 5/00
[52] U.S. Cl. .................................... 329/135; 329/126; 329/124; 329/112
[58] Field of Search ................. 329/50, 110, 112, 122, 329/124, 126, 135; 455/214, 337

[56] References Cited

U.S. PATENT DOCUMENTS 3,970,946 7/1976 Matsuo ............................. 329/135 X
4,090,145 5/1978 Webb ................................ 329/135 X Primary Examiner—Eugene R. LaRoche
Assistant Examiner—Robert J. Pascal
Attorney, Agent, or Firm—Douglas A. Kundrat; F. David LaRiviere

[57] ABSTRACT

A signal receiver having a frequency selective sampling detector which accepts a bandlimited analog signal and outputs uniformly spaced, digital samples of the signal's quadrature and in-phase components. The center frequency, phase reference and sample interval for the detector are derived from a single reference clock. The bandwidth of the detector is variable while maintaining the same center frequency.

4 Claims, 23 Drawing Figures

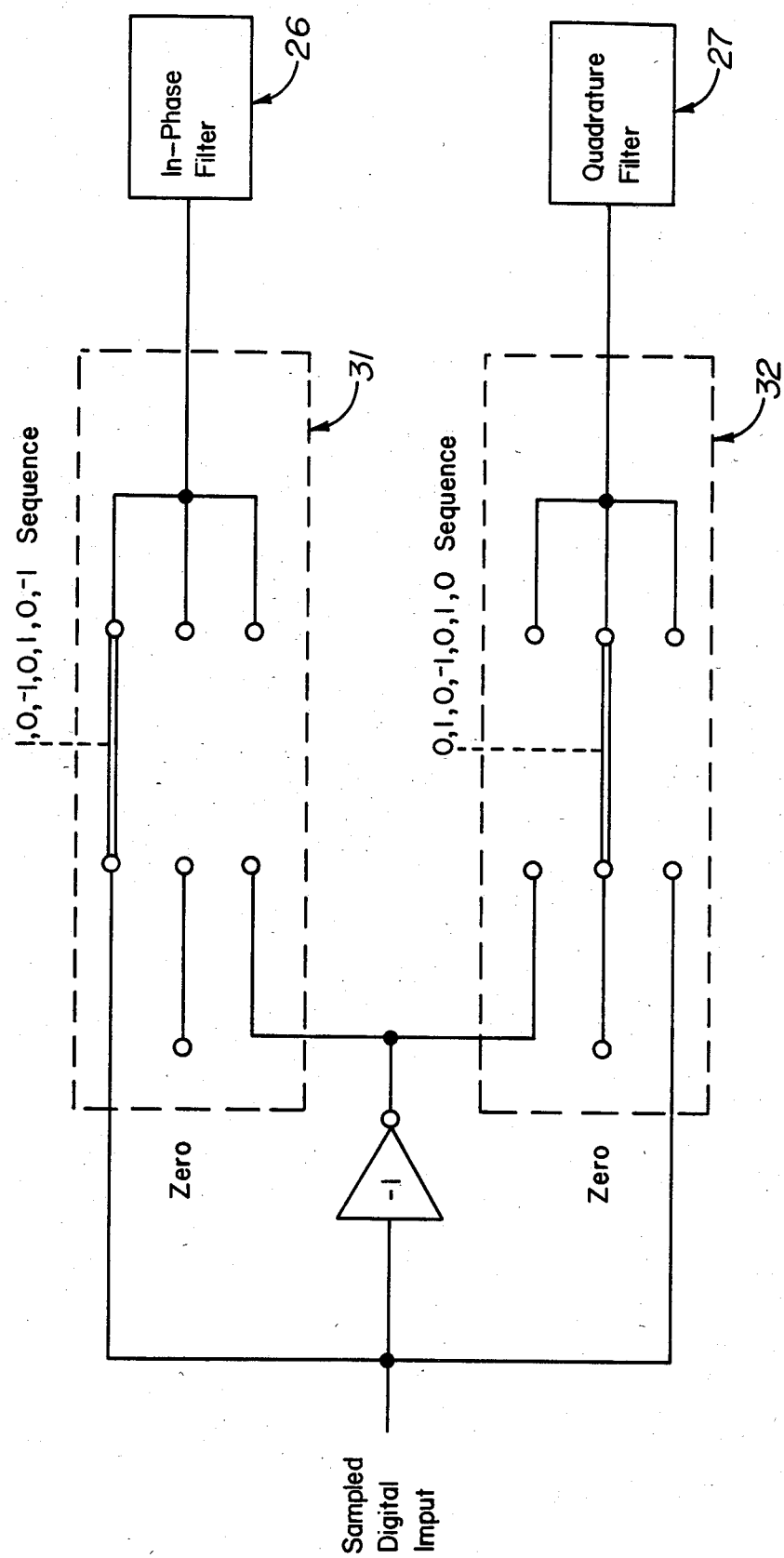

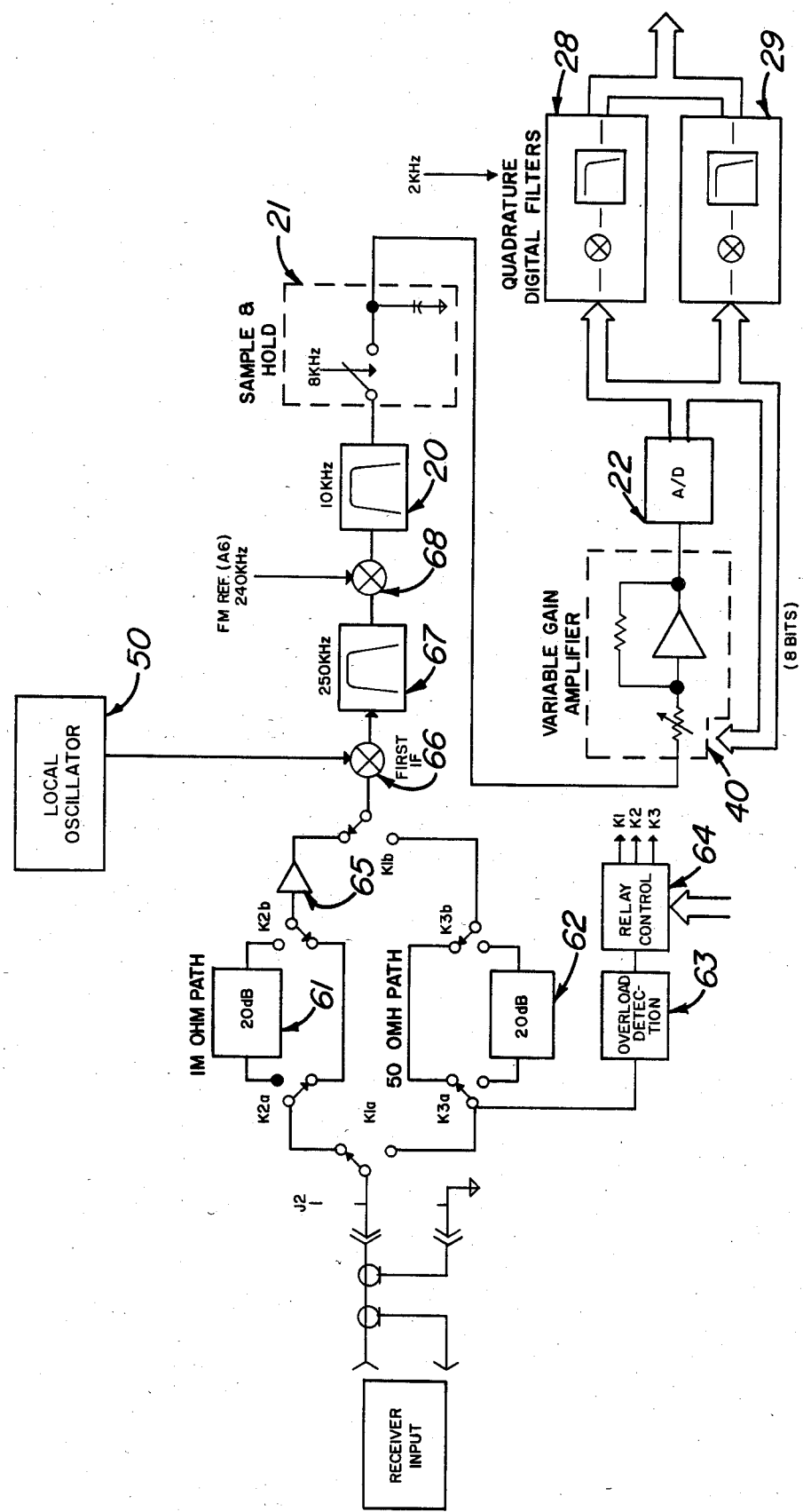

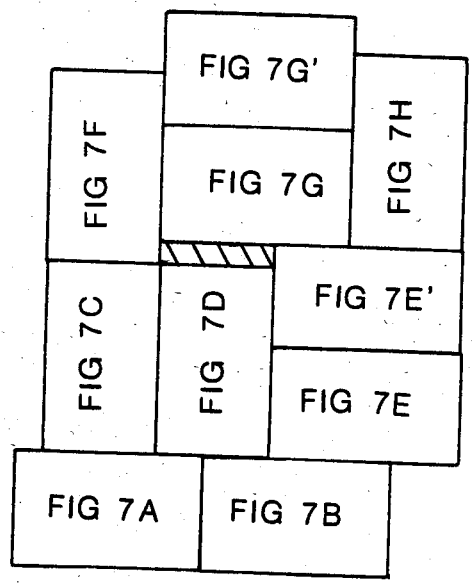

FREQUENCY SELECTIVE SAMPLING DETECTOR

BACKGROUND AND SUMMARY OF THE INVENTION

The detection scheme described in this specification is employed in a network analyzer of the heterodyne class. Heterodyning has been the principal signal processing technique used in both network and spectrum analyzers for many years.

Heterodyning refers to the process by which the modulation signals in a frequency band of interest are successively shifted lower in frequency by mixing and filtering operations. Typically, the final signal frequency band is centered at an intermediate frequency which is convenient for building detectors to extract envelope and phase information (or real and quadrature components) and display information in linear or log form. In the case of most spectrum analyzers, only the envelope (or modulus) is recovered.

First generation spectrum analyzers use completely analog signal processing. That is, all signals, including the measures of magnitude and phase (or real and quadrature components) are represented by, and processed in, analog voltages. These are then conditioned for display on a cathode ray tube or plotter.

A second generation of analyzers use digital conversion of the signals, which conversion occurs after the heterodyning process and detection of the signal at the intermediate frequency. The detector analog signal output, representing magnitude and phase of the modulation signal of interest, is then coverted to digital data for ease of storage and display of swept frequency data. Conversion to digital data facilitates averaging and other post detection processing which is difficult to do in entirely analog circuitry.

Referring to FIG. 1, prior art detection schemes produce magnitude and phase samples. The signal processing of this type of detector is very critical, and such a detector is correspondingly expensive to produce. The center frequency and bandwidth are determined by an analog filter which must be compensated for drift, and separate circuitry is required to produce phase information.

The present invention is incorporated into a network analyzer which represents the first of another generation of analyzers. Such analyzers can be characterized by the hybrid nature of the signal processing, namely, converson of the signals to digital form during the heterodyning process. In the detector of the present invention, two heterodyne frequency shifts precede analog-to-digital conversion. The signal sampling, part of the conversion process, produces another shift, while the final shift is entirely digital.

The center frequency, bandwidth and phase reference of the detector of the present invention are essentially drift-free because these parameters are synthesized from a common reference. Since the analog-to-digital converter (ADC) in the detector is common to both in-phase and quadrature parts of the signal, the amplification and orthogonality of the parts is essentially matched. By properly selecting the sample rate and local oscillator phase, the mixers do not actually multiply, which in turn reduces circuitry and simplifies implementation.

DESCRIPTION OF THE DRAWING

FIGS. 5A and 5B are alternative implementations of multiplexers used in lieu of multipliers in the digital filters of the detector of FIG. 2.

FIG. 6 is a more detailed block diagram of the detector of FIG. 2.

FIG. 7 shows the interconnections of FIGS. 7A–7H.

DESCRIPTION OF THE PREFERRED EMBODIMENT

Figure 1:
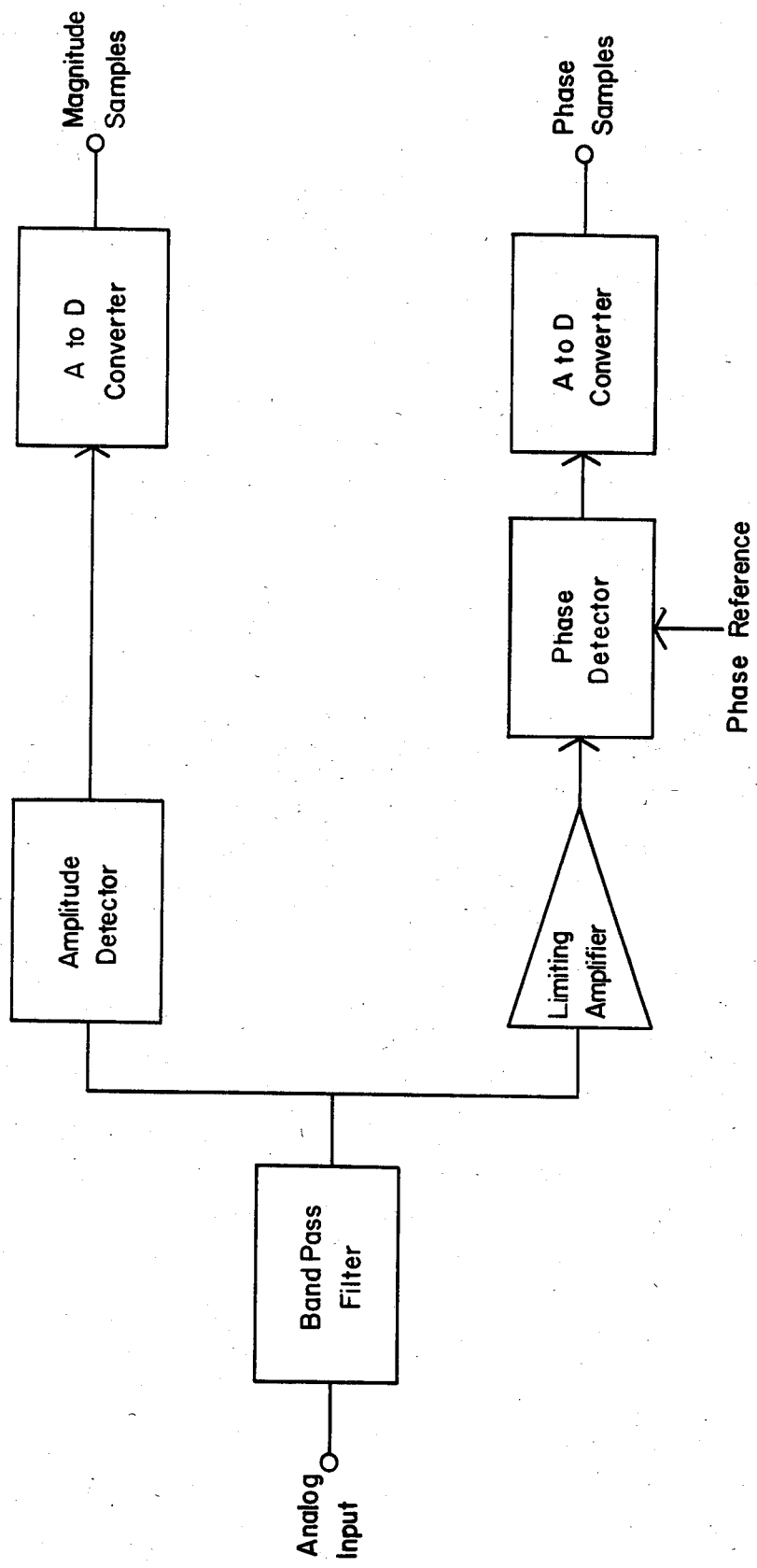
FIG. 1 is a block diagram of a representative detector scheme for prior art receivers.
Figure 2:
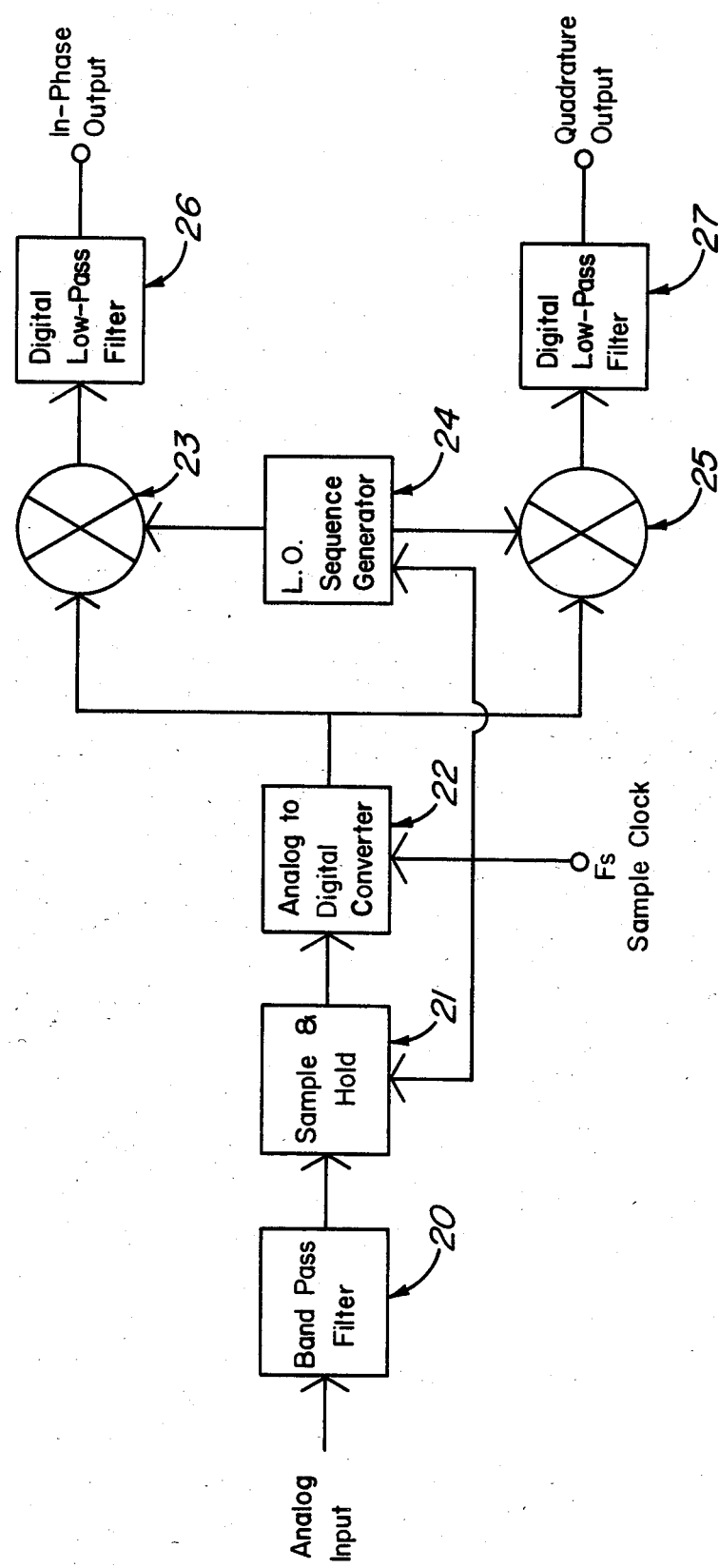
FIG. 2 is a block diagram of a detector scheme for a receiver constructed according to the principles of the present invention.

The essential components of the detector of a receiver constructed according to the principles of the present invention are shown in FIG. 2. The analog input signal is filtered by band-pass filter 20 to a bandwidth of less than Fs/2 centered at a frequency of $(2n+1)Fs/4$ for any integer n, where Fs is the frequency at which samples are taken. The signal is then sampled by sample and hold 21 at a frequency of Fs which has the effect of aliasing the signal down to a band Fs/2 wide, which is centered at Fs/4. The information in the signal is unambiguously preserved because the Nyquist sampling criteria are met. However, the signal is inverted in the frequency domain for cases where the original center frequency was $(2n+1)Fs/4$, where n is an even integer. The sampled analog signal is then converted to digital data format by analog-to-digital converter (ADC) 22.

Detection of the in-phase component of the modulation signal is achieved by multiplier 23 which multiplies the signal by a sampled cosine wave of frequency Fs/4. This generates the desired detected component, centered at D.C., as well as an undesired component centered at Fs/2. The undesired component is removed by digital low-pass filter 26 which follows multiplier 23 in sequence.

Detection of the quadrature component of the signal is accomplished by multiplier 25 which multiplies the signal by a sampled sine wave of frequency Fs/4. The remaining processing by digital filter 27 is identical to that for the in-phase component.

The cutoff frequency of digital low-pass filters 26 and 27 determines the bandwidth of frequencies to which the detector is sensitive. Frequencies which deviate from the designed center frequency of the detector by more than the cutoff of those filters will be converted by multipliers 23 and 25 to frequencies above that cutoff and will not reach the output. Therefore, the bandwidth of the detector is twice the cutoff frequency of digital low-pass filters 26 and 27, and can be adjusted to any desired value less than Fs/2 by appropriate selection of design parameters.

An alternative interpretation of the in-phase and quadrature outputs produced by the detector of the present invention is the real and imaginary part of a single-complex signal resulting from multiplying the output of ADC 22 by $$e^{j2\pi(Fs/4)} = \cos 2\pi(Fs/4) + j \sin 2\pi(Fs/4).$$

Figure 3A:
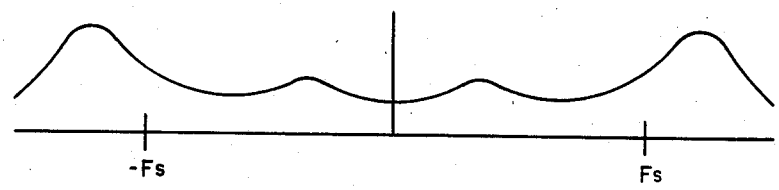
FIGS. 3A–3F are frequency domain plots of a signal processed by the detector of FIG. 2.
Figure 3B:
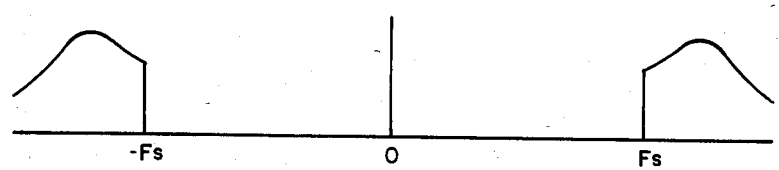
Figure 3C:
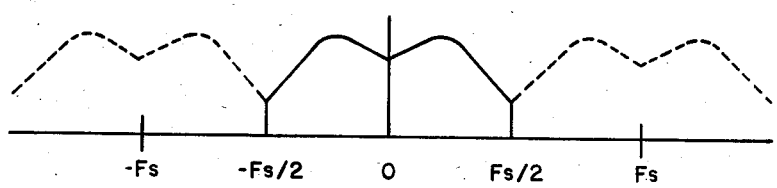
Figure 3D:
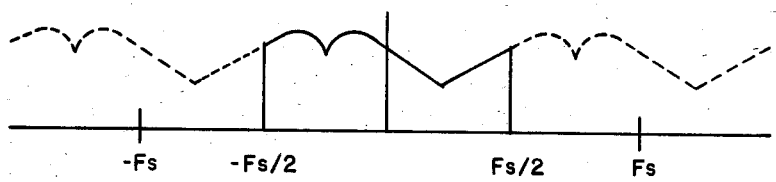
Figure 3E:
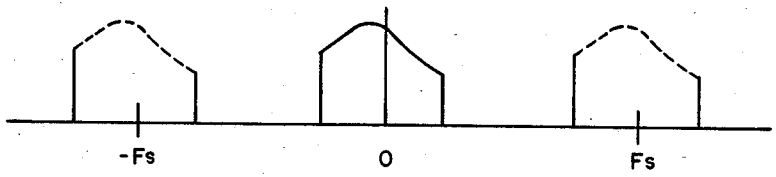
Figure 3F:
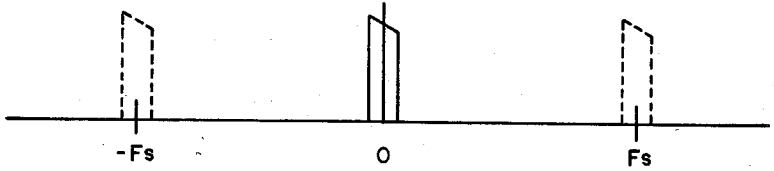

Using this interpretation of the output, the signal processing of the detector is graphically summarized in the frequency domain plots of FIGS. 3A–3F. For the analog signal of FIG. 3A, a center frequency of 5Fs/4 for band pass filter 20 yields the plot of FIG. 3B. FIG. 3C shows the signal of FIG. 3B after sampling by sample and hold 21, where the solid line of the plot is the fundamental Nyquist interval. After the signal of FIG. 3C is multiplied by $e^{j2\pi}Fs/4$, it becomes assymetric in the frequency domain as shown in FIG. 3D and has both a real and an imaginary part. FIGS. 3E and 3F show the signal of FIG. 3D filtered by digital filter 26 to cutoffs of Fs/4 and Fs/16, respectively. The bandwidth can be arbitrarily narrowed by additional digital filtering.

Figure 4:
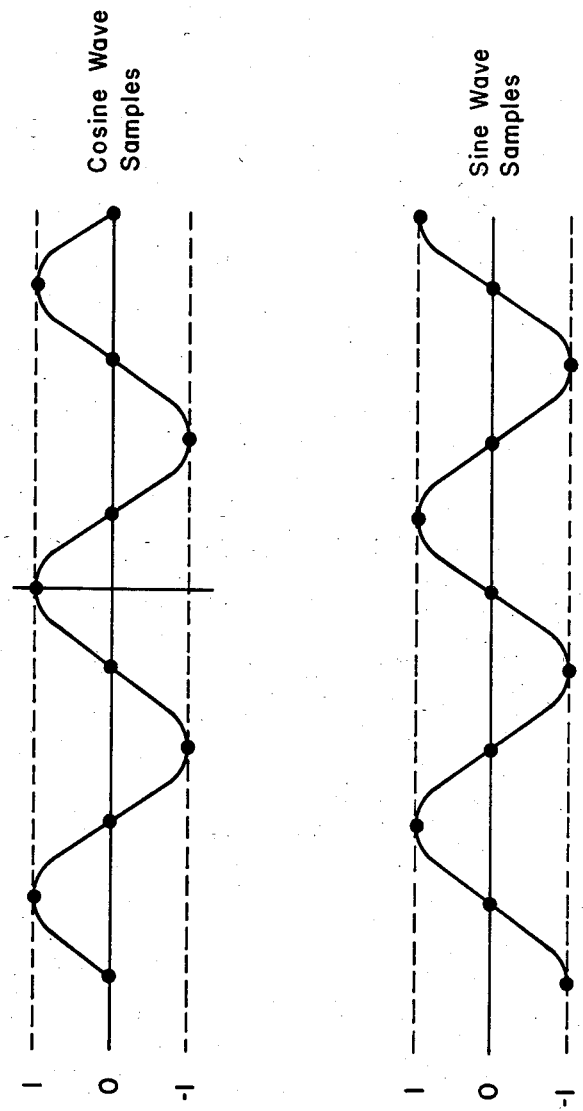
FIG. 4 is a diagram of the phase relationship of the cosine and sine samples relative to Fs of the detector of FIG. 2.
Figure 5B:
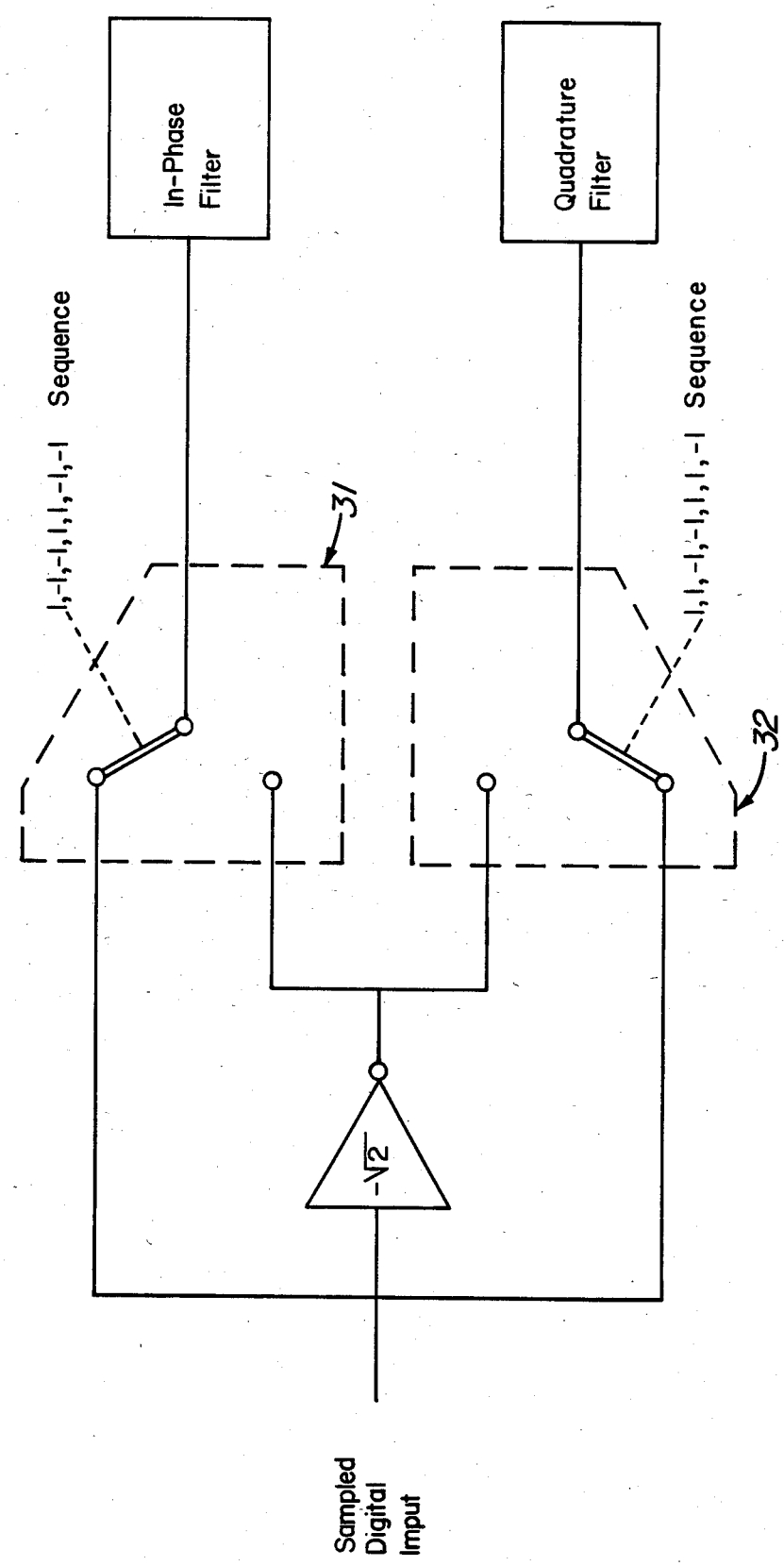
Figure 7A:
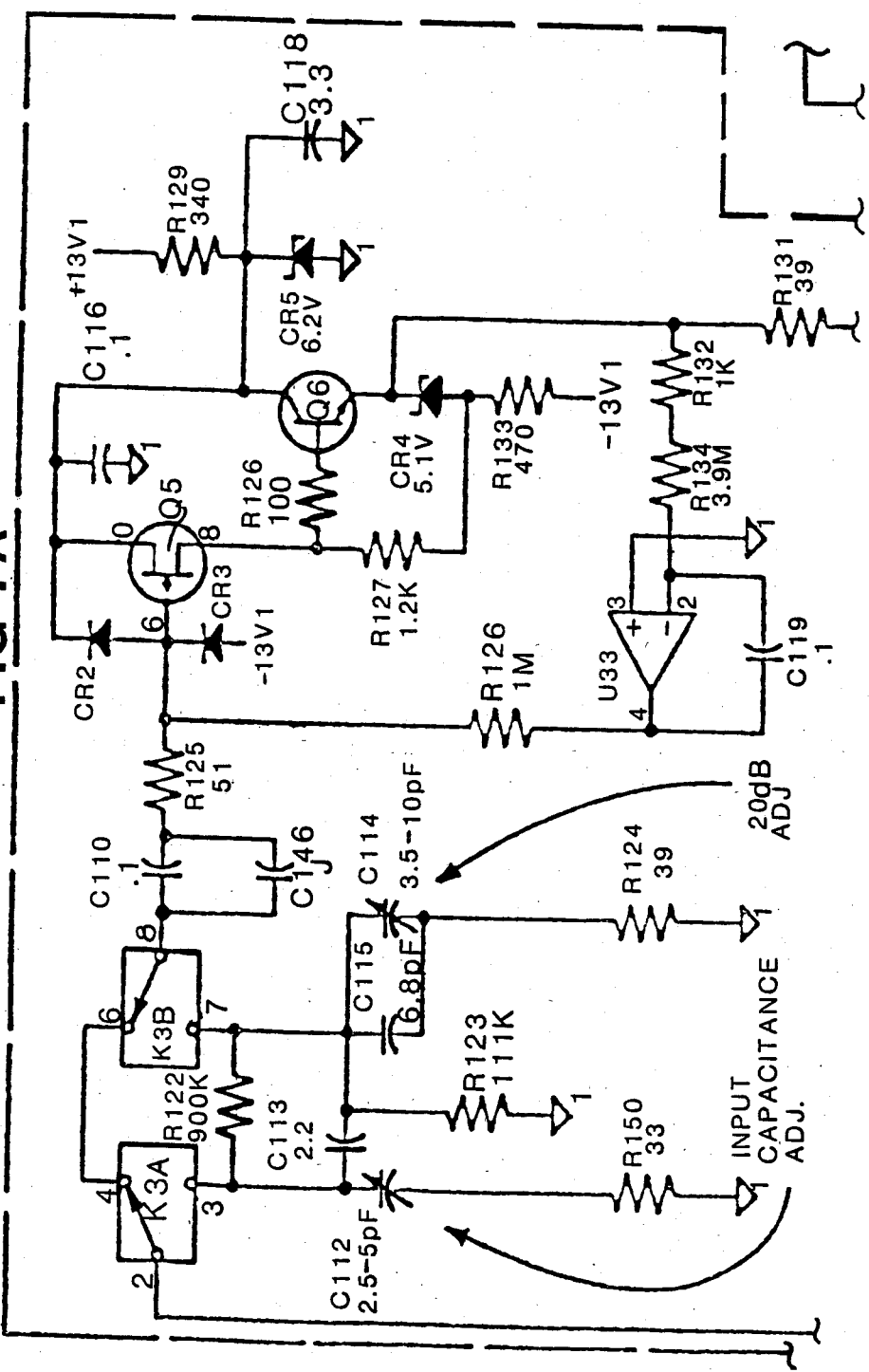
FIGS. 7A–7H constitute a schematic diagram of the detector of FIG. 6.
Figure 7B:
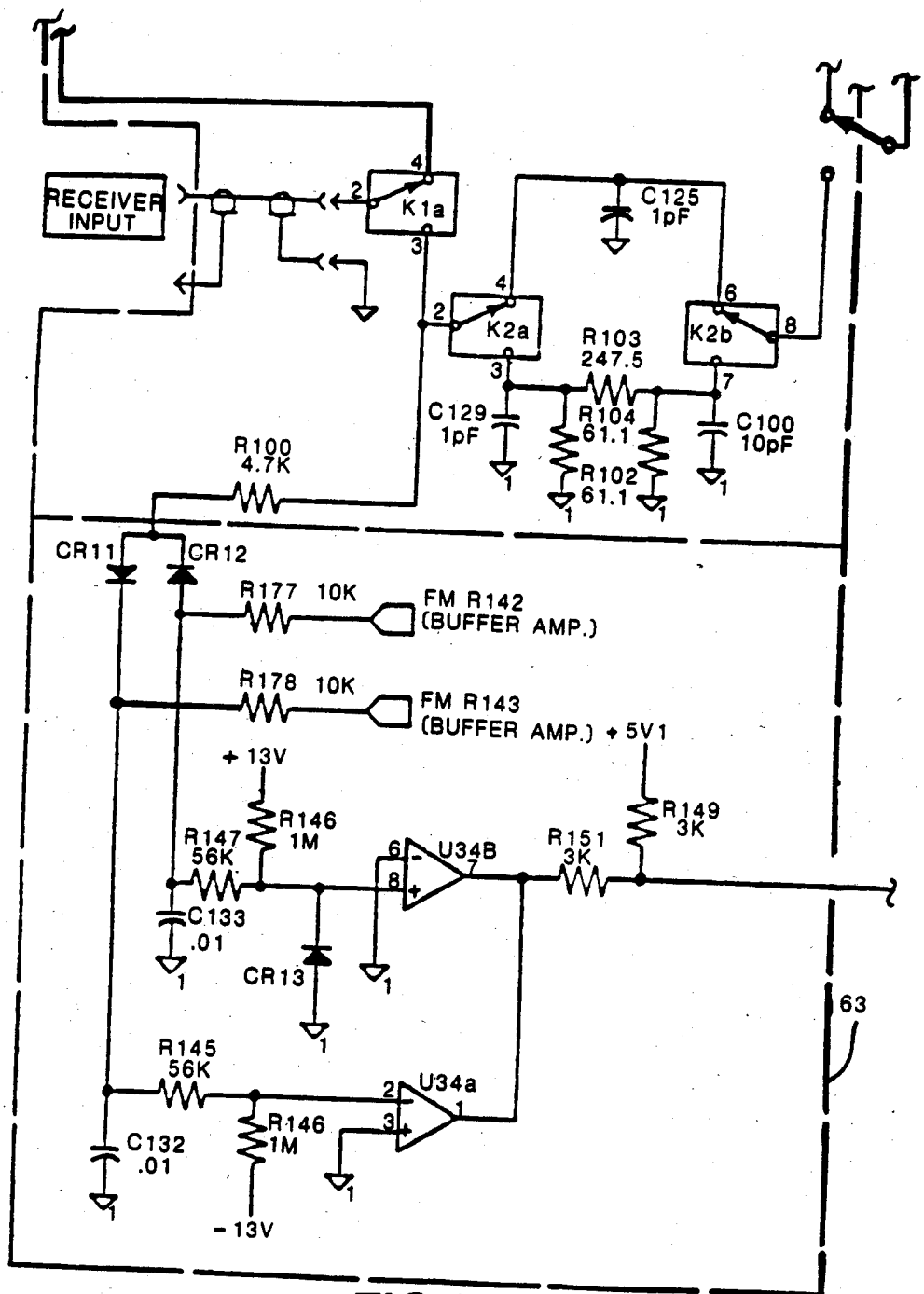
Figure 7C:
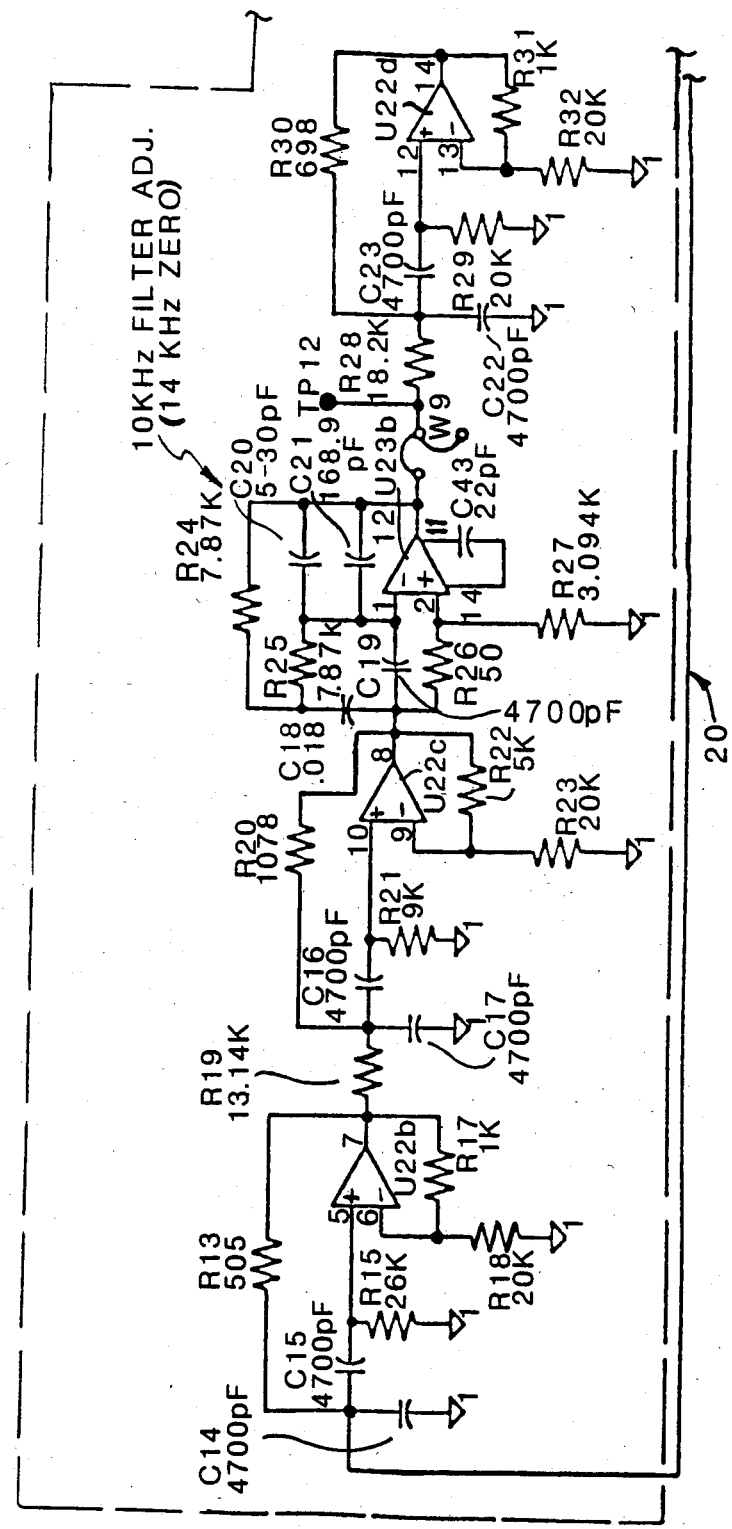
Figure 7D:
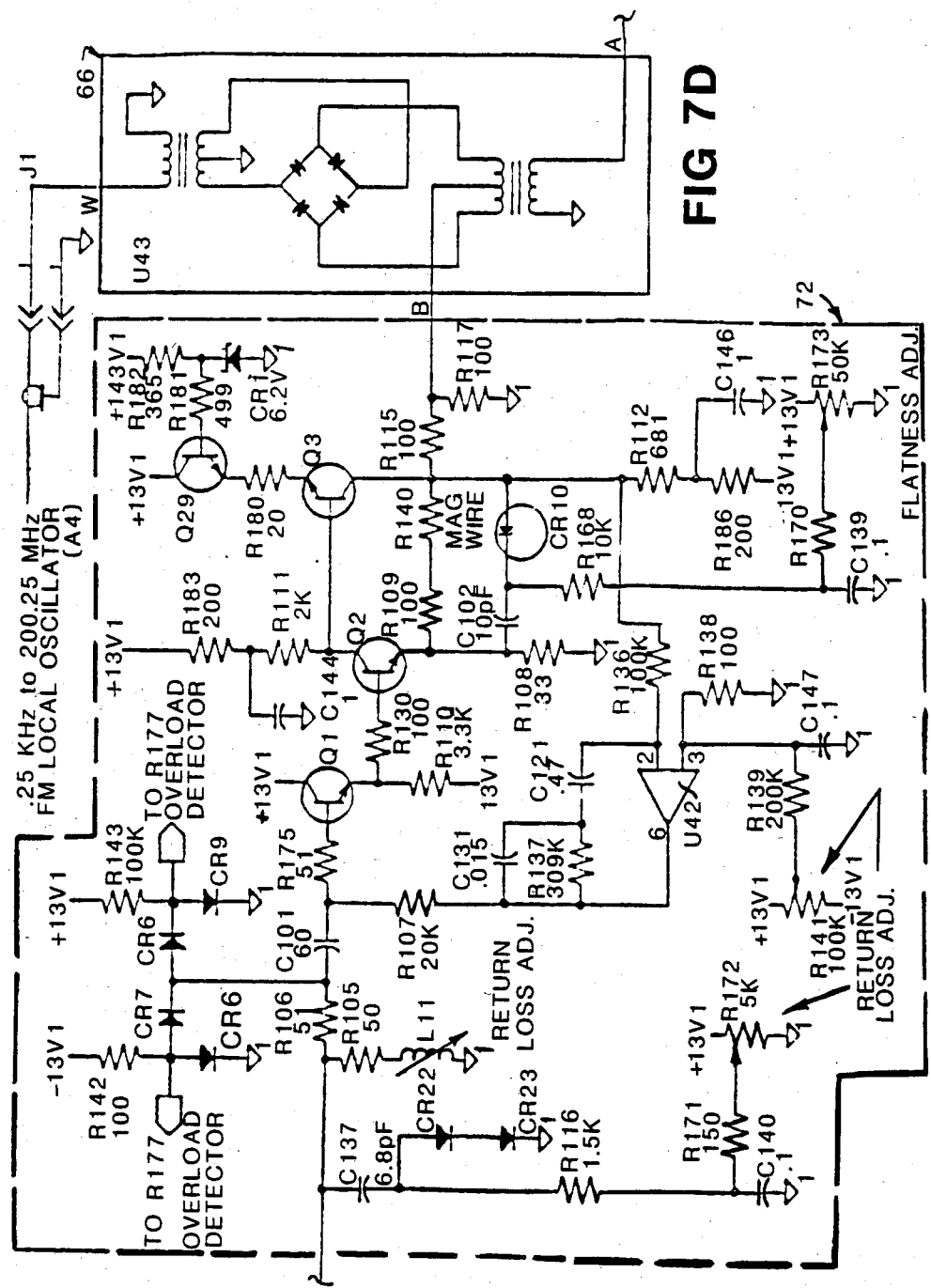
Figure 7E:
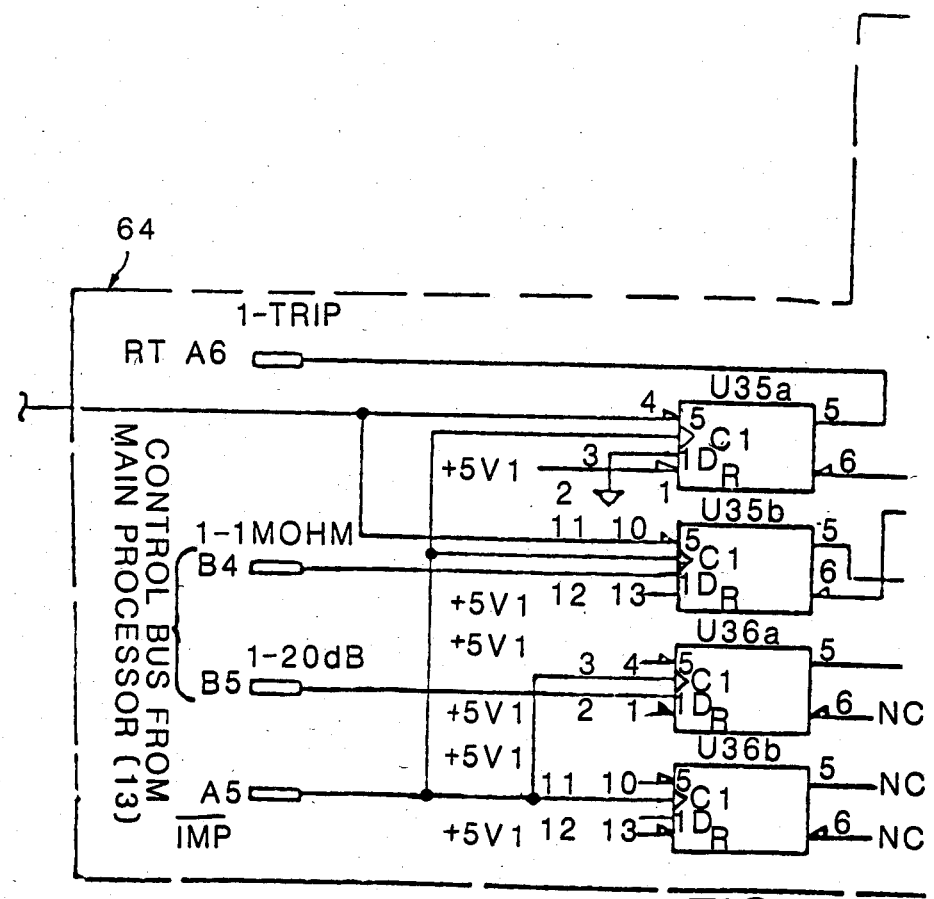
Figure 7E:
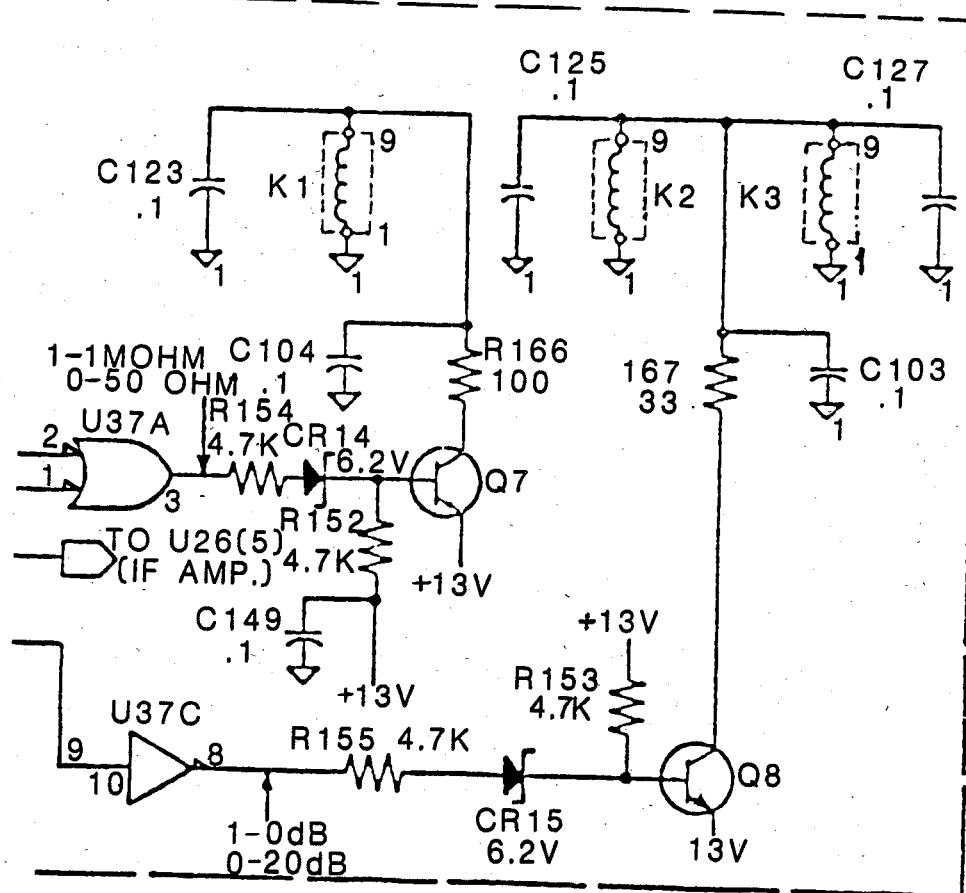
Figure 7F:
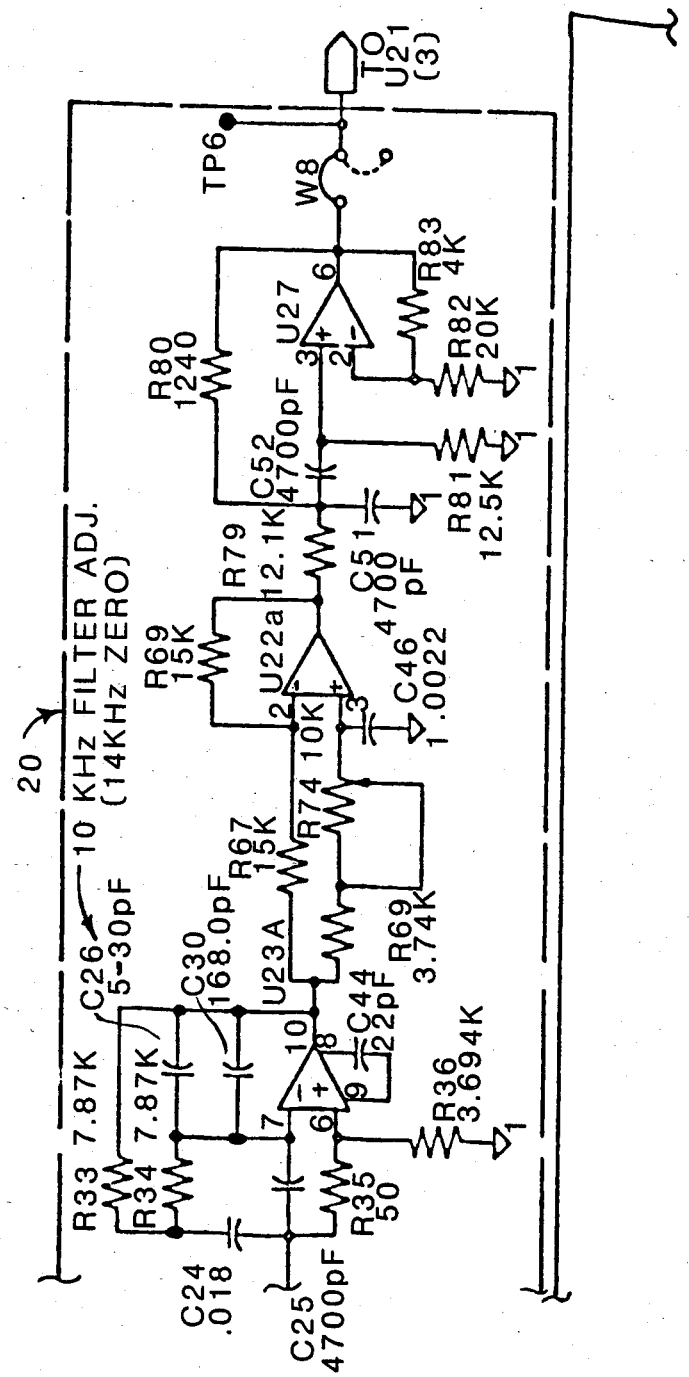
Figure 7G:
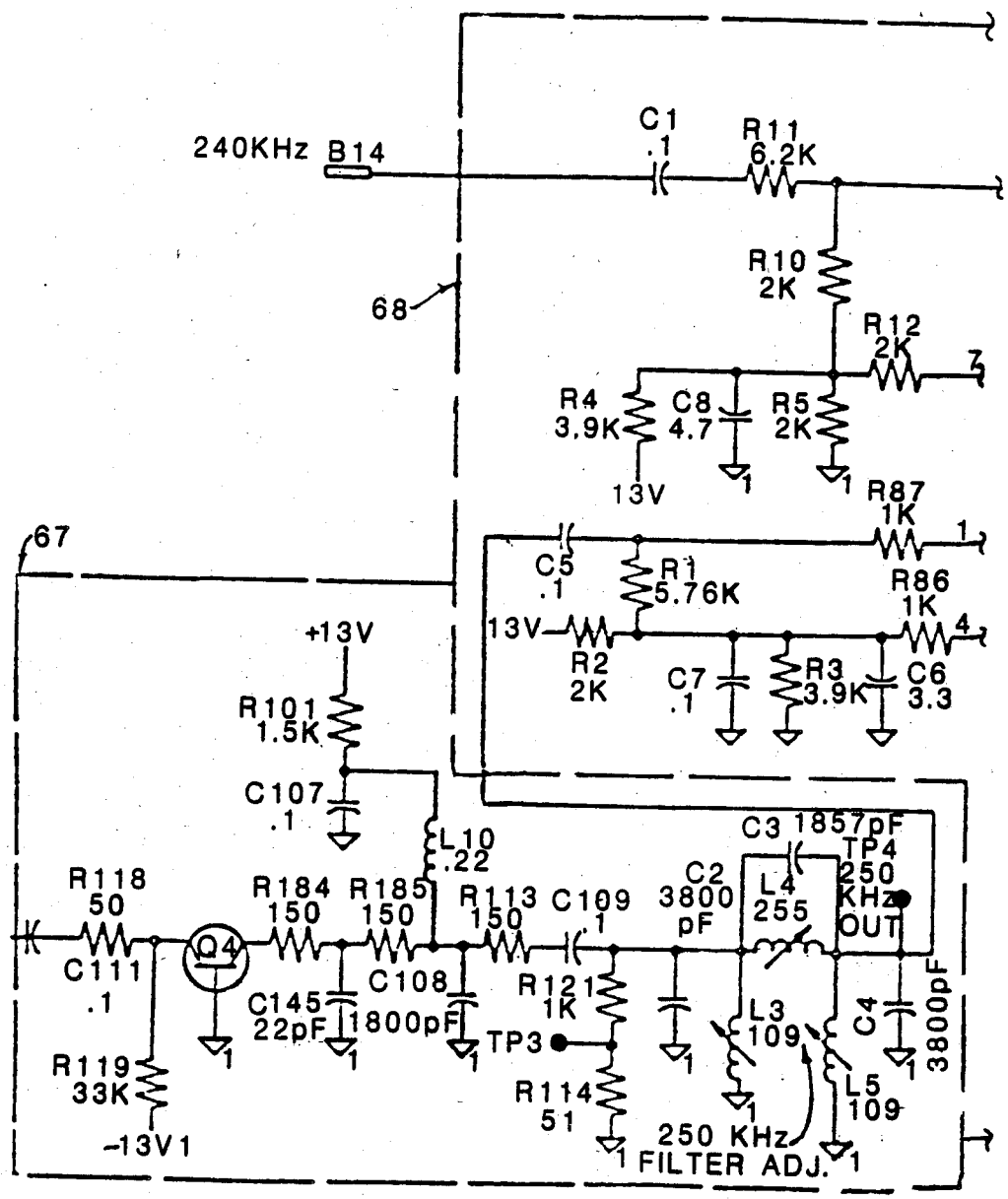
Figure 7G:
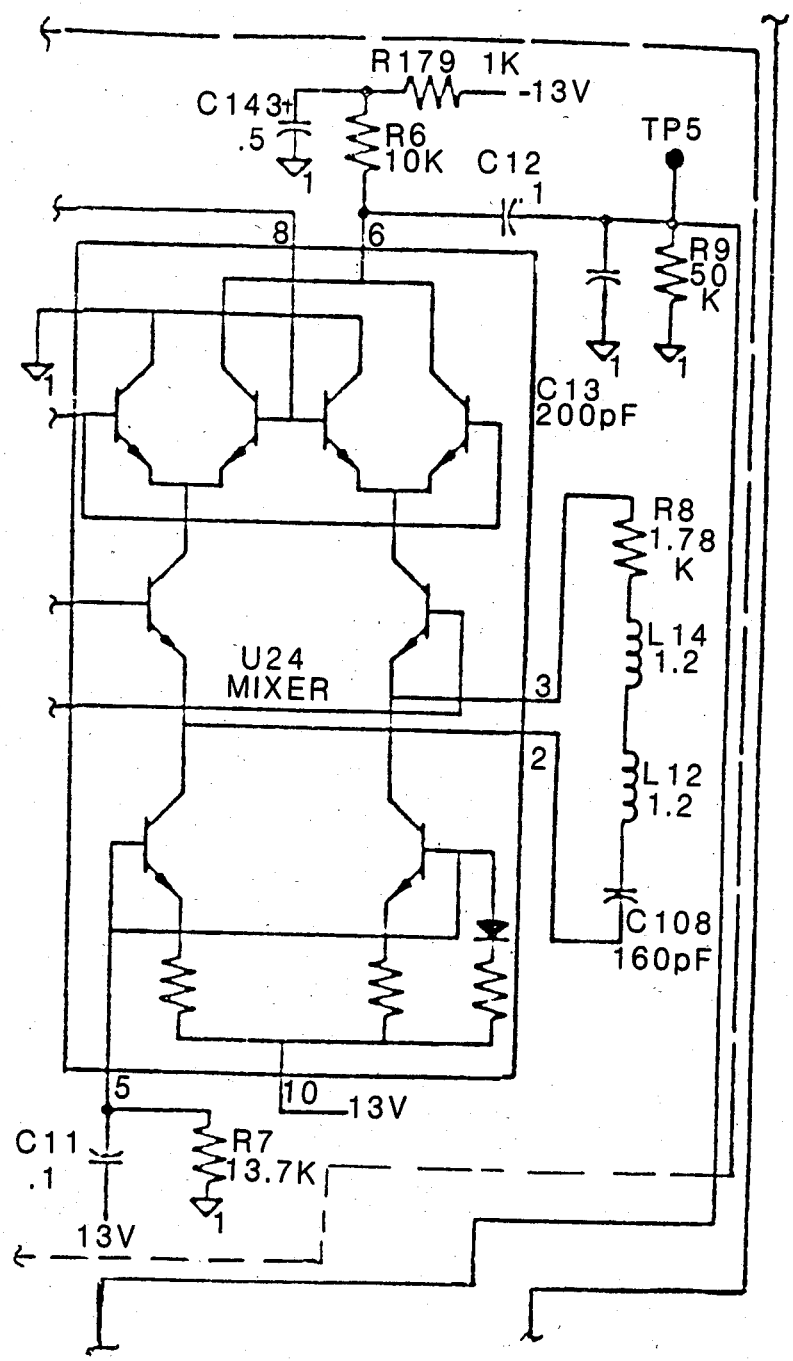
Figure 7H:
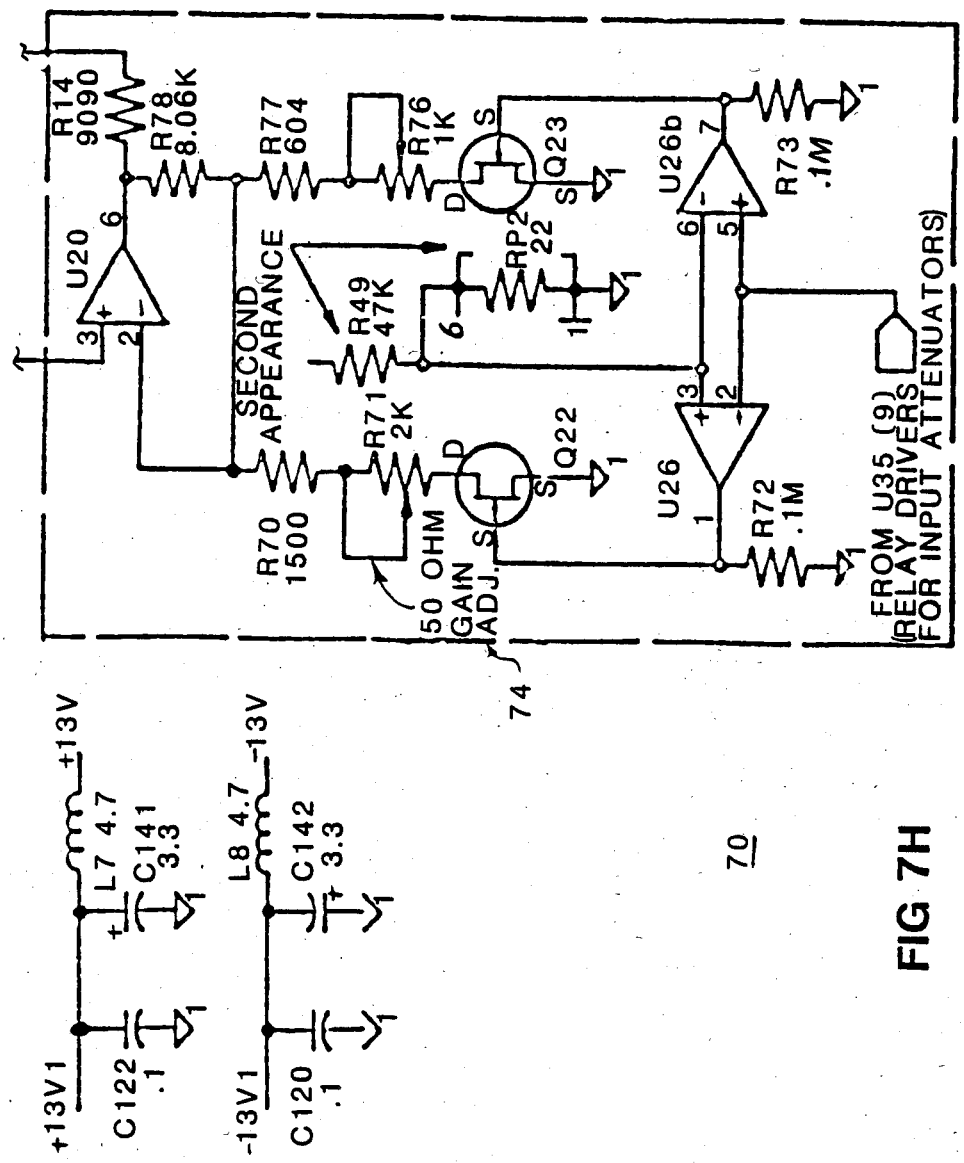

As stated elsewhere in this specification, the signal of FIG. 3C is multiplied by cosine and sine waves of frequency Fs/4 to yield in-phase and quadrature components of the sampled signal, respectively. If the phase, relative to Fs, of the local oscillator (LO) in LO sequence generator 24 is selected as shown in FIG. 4, actual multiplication becomes unnecessary. Instead, multipliers 23 and 25 can be implemented by multiplexers 31 and 32 at the input of digital filters 26 and 27, respectively as shown in FIG. 5A.

Alternatively, the samples for both the sine and cosine waves may be shifted by 45° and the amplitudes scaled up by $\sqrt{2}$. This technique yields the implementation of FIG. 5B.

The block diagram of FIG. 6 provides additional detail for the detector of FIG. 2, including the conversion of input impedance paths for different measurement requirements. Again, the input signal to the receiver section is translated in frequency and filtered using a hybrid of analog and digital processing. In the 1-megohm input position, the input signal goes through a 1-megohm, 0-to-20 dB attenuator 61. In the 50 ohm input position, a higher frequency response is possible through attenuator 62. Overload detector 63 measures the signal level at the input to the 50 ohm attenuator, and if a damage-level signal is present, input relay control 64 trips and automatically selects the 1-megohm input position.

With continuing reference to FIG. 6, after the input attenuator, the signal is transmitted through unity-gain buffer amplifier 65 to mixer 66 for down conversion. Mixer 66 is a diode and transformer double-balanced mixer. The signal from local oscillator (LO) 50 is a 7 dBm tracking signal that is tuned to 250 kHz above the input frequency. Thus, the frequency range of LO 50 is 250 kHz to 200.25 MHz. The output of mixer 66 is a constant 250 kHz IF. Following mixer 66 is bandpass filter 67 that has a zero at 230 kHz, the image frequency for mixer 68. Mixer 68 is a transistor array with an LO drive of 240 kHz. The 250 kHz and 240 kHz signals mix to provide the 10 kHz IF, which is then amplified to levels that provide an optimum signal-to-noise ratio for bandpass filter 20, an RC active 1.7 kHz wide, 10 kHz center frequency, bandpass filter.

The purpose of bandpass filter 20 is to provide an antialiasing filter of approximately 1.7 kHz bandwidth. The filter comprises a cascade of six active second-order RC sections. Two of these sections have a transmission zero at 14 kHz, which is necessary to reject any signal aliasing with the second harmonic of the 8 kHz sampling frequency used in the following sample-and-hold circuit 21. Also included in the 10 kHz bandpass filter is an all-pass network stage that provides a means of adjusting the phase shift through the filter. The sequence in which the second-order sections are cascaded is optimized for the best noise performance.

The 10 kHz signal is sampled at an 8 kHz rate by sample-and-hold circuit 21. The Nyquist criteria for sampling is met because a bandwidth of 1.7 kHz is sampled at 8 kHz. The information from 10 kHz can be thought of as being translated in frequency from 10 kHz to 2 kHz just in the same way as if it had been downconverted in a mixer.

The sampled signal is converted from an analog signal to a digital sequence by (ADC) 22, which is a 8/12-bit successive-approximation IC which is described more fully in co-pending patent application entitled "Floating Point Analog-to-Digital Converter" filed by the inventor hereof. An important part of the total analog-to-digital process is variable-gain amplifier 40 in front of ADC 22, also described in the aforementioned copending application. The converter operates in a two-pass operation. On the first pass, the amplifier 40 is set to a gain of 1.1 and an 8-bit conversion is made. This output is processed by a state machine and a number is fed back to program the amplifier to the gain required to provide signal magnitude of approximately full-scale of ADC input. The second-pass conversion is then done to a 12-bit resolution. The results of the two conversions are combined to produce a 26-bit word (some of these bits only have position significance). This two-pass conversion approach can provide not only a 12-bit resolution at full scale, but 12-bit resolution all the way down to 42 dB below full scale.

The output of ADC 22 is a digital sequence representing a 2 kHz signal. This output contains both the amplitude and phase information of the signal coming into the receiver input. Quadrature detection is used to extract the required amplitude and phase data. The digital sequence representing the 2 kHz signal is applied to two digital mixers simultaneously, each of which comprise part of quadrature digital filters 28 and 29. One mixer uses a local oscillator that generates a digital sequence representing a sampled cosine function. The other mixer uses samples of a sine function. The results of these mixing processes are two data streams, one representing the real part of the input signal and the other representing its imaginary part.

The two data streams are filtered separately by digital filters that define the instrument's resolution bandwidth (1 Hz, 10 Hz, 100 Hz, and 1 kHz). The filters are four-pole, Bessel filters implemented as custom integrated circuits. These variable-bandwidth filters allow the accurate measurement of devices with steep frequency responses and help reduce the measurement noise. The output of the filters is a 24-bit two's complement number.

Referring finally to FIG. 7, receiver 70 is a low noise receiver tuned to a source frequency and tracks the source as it is swept. The receiver can be tuned from 5 Hz to 200 MHz with tuning bandwidth of 1 Hz to 1 kHz in decade values. The input signal is processed using both analog and digital signal techniques. The analog processing includes input impedance, input attenuation, and frequency conversion from the source frequency to a 10 kHz intermediate frequency (IF) with amplitude and phase information preserved. The digital signal processing includes sampling the 10 kHz IF at an 8 kHz rate to create a 2 kHz digital IF. The real and imaginary phasor components are extracted using quadrature mixing via digital filters. These filters also set the receiver tuning bandwidth.

Input Attenuator 71 includes relay K1 which selects the receiver input impedance. The relaxed state for the relay is the 1M ohm position. Relays K2 and K3 select input attenuation, over the range 0 to 20 dB. Each impedance path has its own 20 dB attenuator. The relaxed state for relays K2 and K3 are in the 0 dB attenuation position. Relays K2 and K3 are always switched together. The 1 M ohm path also has buffer amplifier U33 which is used as an impedance coverter. It converts from a 1M ohm to a 50 ohm environment for further processing.

Unity gain buffer 72 amplifier consists of a 12 dB amplifier and a 12 dB attenuator. Both the amplifier and the attenuator are used to increase isolation between the first mixer and the input of the detector. The buffer amplifier consists of Q1, Q2, Q3 and Q29. U42 is used in a dc servo loop to compensate for mixer feedthrough. Diodes CR11 and CR12 detect the positive and negative peaks of the input signal. If the input signal is greater than ±1.1 V peak, comparators U34a and b will signal an overload, which sets the input impedance relay to the 1M ohm position.

First mixer 66 down converts the 5 Hz to 200 MHz source frequency to a 250 kHz IF, using the 0.25 MHz to 200.25 MHz local oscillator signal from the local oscillator 50. Bandpass filter 73 rejects all higher frequency mixer products from the first mixer. This filter also provides a zero at 230 kHz, which is the image frequency for mixer 68, to cancel any signals at that frequency. Q4 presents a 50 ohm load to mixer 66 to assure a flat frequency response at the output of mixer 66.

Mixer 68 down converts the 250 kHz first IF frequency to the 10 kHz second IF. Another local oscillator supplies the 240 kHz reference signal, and L14, L12, and C106 are used to drop the gain of the mixer at input frequencies other than 250 kHz.

IF amplifier 74 provides isolation between mixer 68 and bandpass filter 20. It also sets the overall receiver gain to unity for both the 50 ohm and 1M ohm impedance position of input attenuator 71.

Bandpass filter 20 cancels all upper frequency products from mixer 68. It also provides a zero at 14 kHz to cancel the 254 kHz feedthrough from mixer 66 when the source is programmed for 4 kHz.

Sample and hold circuit samples the 10 kHz IF at an 8 kHz rate. This sampling action effectively down converts the 10 kHz IF to a 2 kHz digital IF. The 2 kHz signal is a stairstep output.

I claim:

1. A detector for detecting amplitude and phase of modulation on a carrier signal, said detector comprising a bandpass filter, for filtering the carrier signal received therefrom to a first selectable bandwidth at a first selectable center frequency:

sample and hold means, coupled to the bandpass filter, for sampling the carrier signal received therefrom at a selectable rate;

converter means, coupled to the sample and hold means, for converting the carrier signal received therefrom to digital data;

first multiplier means, coupled to the converter means, for multiplying the digital data received therefrom by a first selectable signal to produce an in-phase component of the modulation of the carrier signal;

second multiplier means, coupled to the converter means, for multiplying the digital data received therefrom by a second selectable signal to produce the quadrature component of the modulation of the carrier signal; and first and second filter means coupled to the first and second multiplier means, respectively, for filtering undesired components of the modulation signals received therefrom.

2. A detector for detecting amplitude and phase on a carrier signal, said detector comprising:

an attenuator for receiving the carrier signal;

a first mixer, coupled to the attenuator, for down-converting the carrier signal received therefrom to a first selectable intermediate frequency;

a first bandpass filter, coupled to the first mixer, for filtering the carrier signal received therefrom to a first selectable bandwidth at a first selectable center frequency;

a second mixer, coupled to the first bandpass filter, for down-converting the carrier signal received therefrom to a second selectable intermediate frequency;

a second bandpass filter, coupled to the second mixer, for filtering the carrier signal received therefrom to a second selectable bandwidth at a second selectable center frequency;

sample and hold means, coupled to the second bandpass filter, for sampling the carrier signal received therefrom at a selectable rate;

converter means, coupled to the sample and hold means, for converting the carrier signal received therefrom to digital data;

first multiplier means, coupled to the converter means, for multiplying the digital data received therefrom by a first selectable signal to produce the in-phase component of the modulation of the carrier signal;

second multiplier means, coupled to the converter means, for multiplying the digital data received therefrom by a second selectable signal to produce a quadrature component of the modulation of the carrier signal; and first and second filter means coupled to the first and second multiplier means, respectively, for filtering undesirable components of the modulation signals received therefrom.

3. A detector as in claim 1 wherein the first and second multiplier means multiply the digital data by a signal representing the relation $$e^{j2\pi(Fs/4)} = \cos 2\pi(Fs/4) + j \sin 2\pi(Fs/4),$$

where Fs is the frequency at which the carrier signal is sampled.

4. A detector as in claim 2 wherein the first and second multiplier means multiply the digital data by a signal representing the relation $$e^{j2\pi(Fs/4)} = \cos 2\pi(Fs/4) + j \sin 2\pi(Fs/4),$$

where Fs is the frequency at which the carrier signal is sampled.

* * * * *